United States Patent
Laengle

(10) Patent No.: US 8,717,581 B2
(45) Date of Patent: May 6, 2014

(54) METHOD FOR DETERMINING THE POSITION OF A STRUCTURE WITHIN AN IMAGE AND POSITION MEASURING DEVICE FOR CARRYING OUT THE METHOD

(75) Inventor: Mario Laengle, Weimar (DE)

(73) Assignee: Carl Zeiss SMS GmbH, Jena (DE)

(*) Notice: Subject to any disclaimer, the term of this patent is extended or adjusted under 35 U.S.C. 154(b) by 266 days.

(21) Appl. No.: 13/247,914

(22) Filed: Sep. 28, 2011

(65) Prior Publication Data
US 2012/0081712 A1    Apr. 5, 2012

Related U.S. Application Data

(60) Provisional application No. 61/387,524, filed on Sep. 29, 2010.

(30) Foreign Application Priority Data

Sep. 29, 2010    (DE) .......................... 10 2010 047 051

(51) Int. Cl.
  *G01B 11/14*    (2006.01)
(52) U.S. Cl.
  USPC .......................................................... 356/620
(58) Field of Classification Search
  USPC .......................................................... 356/620
  See application file for complete search history.

(56) References Cited

U.S. PATENT DOCUMENTS

2006/0244950 A1*  11/2006  Wegmann ...................... 356/124
2007/0154069 A1*   7/2007  Chen et al. ..................... 382/107
2010/0208935 A1    8/2010  Arnz et al. ..................... 382/100

FOREIGN PATENT DOCUMENTS

| DE | 10047211 | 5/2002 | ............. G01B 11/00 |
| DE | 10337767 | 3/2005 | ............. G03F 7/20 |
| DE | 102006059431 | 6/2008 | ............. G03F 7/20 |
| DE | 102007033815 | 11/2008 | ............. G03F 9/00 |

OTHER PUBLICATIONS

Brunner, "Impact of Lens Aberrations on Optical Lithography", IBM Journal of Research and Development, vol. 41, No. 1/2, Jan./Mar. 1997.

* cited by examiner

*Primary Examiner* — Tarifur Chowdhury
*Assistant Examiner* — Omar Nixon
(74) *Attorney, Agent, or Firm* — Fish & Richardson P.C.

(57) ABSTRACT

A method is provided for determining the position of a structure within an image relative to a reference point, in which the structure has a center of symmetry, the method comprising: providing an image which comprises the structure and which has a reference point, carrying out at least one symmetry operation of the image with respect to the reference point, by means of which at least one mirror image is obtained which has a mirrored structure congruent relative to the structure, determining at least one displacement vector between a structure and a mirrored structure or two mirrored structures, and calculating the position of the structure as a position of the center of symmetry of the structure relative to the reference point from the at least one displacement vector. Furthermore, a position measuring device is provided for determining the position of a structure within an image relative to a reference point.

20 Claims, 5 Drawing Sheets

METHOD FOR DETERMINING THE POSITION OF A STRUCTURE WITHIN AN IMAGE AND POSITION MEASURING DEVICE FOR CARRYING OUT THE METHOD

CROSS REFERENCE TO RELATED APPLICATIONS

Pursuant to 35 U.S.C. §119, this application claims the benefit of U.S. provisional application 61/387,524, filed on Sep. 29, 2010, and German application DE 10 2010 047 051.1, filed on Sep. 29, 2010, both of which are incorporated by reference.

DESCRIPTION

The invention relates to a method for determining the position of a structure within an image relative to a reference point.

The invention additionally relates to a position measuring device for carrying out the method.

In lithography for producing semiconductor components, the structures of reticles, which are also designated synonymously as a mask, are projected onto wafers by means of scanners or steppers. The wafers are coated with a light-sensitive layer, the resist. In mask inspection microscopes or position measuring devices, the structure of a reticle is projected onto a light-sensitive spatially resolved detector, such as a CCD chip (charge coupled device), for example, with the aid of optical units.

The highly precise position measurement of structures on masks is also designated as "registration" or "photomask pattern placement" (PPPM). By means of a position measuring device (registration tool), specific control structures—designated as "registration pattern"—on the masks such as squares, crosses or angles, for example, are measured and compared with their desired positions. Positions of structures on the mask which are part of the used structures of the mask are also measure. This is designated as "real pattern registration."

The measurement of the masks serves, in the process of writing the masks by means of electron beam writers, to check the positional accuracy of the structures on the mask. Furthermore, the measurement of the structures of an existing mask set makes it possible to quality the deviation of the structure positions of the different masks for the individual lithographic layers with respect to one another. This deviation of the structure positions from mask to mask is also designated as "overlay."

In order to monitor positions of structures, an image of an excerpt from a mask is recorded by means of a position measuring device. In this case, the mask lies on a stage that allows a displacement of the mask in the direction of the mask plane in order to enable the positioning of a desired excerpt in the image field of the position measuring device for recording the image by means of the detector. The mask is aligned prior to the measurement on the stage, such that its position on the stage is known. A relative alignment of the mask with respect to specific alignment structures can also be effected. The position determination is then effected relative to these structures, which are also designated as alignment markers. Consequently, the image can be unambiguously assigned to the absolute or relative position of the excerpt on the mask. The determination of the position of the structure within the recorded image makes it possible to compare desired and actual positions of the structures on the mask.

DE12006059431 describes a method for determining the position of a structure on a carrier relative to a reference point of the carrier by superimposing the structure with a reference structure.

DE10047211 discloses a method for determining the position of edges of a structure. Here the measured edge profiles are compared with model intensity profiles in order to find the position of best correspondence.

DE10337767 describes a method for determining the distance between a reference element and a structure for measuring the overlay displacement.

DE102007033815 discloses a method for determining the distance between a reference element and a structure with two pattern elements for measuring the overlay displacement, wherein one of the pattern elements, the position of which pattern element is to be determined, is amplified in the reference element or in the structure.

In the known methods it is disadvantageous that, in order to determine the position of a structure in an image, it is necessary to provide a reference structure of identical type or at least one model edge of the structure to be determined. The reference images or model edges first have to be created by recording aerial images of structures of identical type.

Therefore, the object of the invention is to provide an efficient method which makes it possible to determine the position of a structure within an image.

According to the invention, this object is achieved by means of a method for determining the position of a structure within an image relative to a reference point, wherein the structure has a center of symmetry, comprising the following steps:

providing an image which comprises the structure,
carrying out at least one symmetry operation of the image with respect to the reference point, by means of which at least one mirror image is obtained which has a mirrored structure congruent relative to the structure,
determining at least one displacement vector between a structure and one mirrored structure or two mirrored structures, and
calculating the position of the structure as a position of the center of symmetry of the structure relative to the reference point from the at least one displacement vector.

This measure has the advantage that neither a reference image nor a model edge of the structure has to be provided. From the image comprising the structure whose position is to be determined, a mirror image is produced by means of a symmetry operation, said mirror image being used as a reference image. It is advantageous that the reference image thus produced corresponds to the structure to a high degree, which leads to a high accuracy of the method. For example differences in size or edge profile, as might be the case for example with different recordings or model edges cannot occur.

From the position of the reference point on the mask relative to reference markings (alignment markers) formed especially on the mask, or from the absolute position of the reference point on the mask, the respective actual position of the structure on the mask is calculated.

The method can also comprise recording an aerial image comprising at least the structure. The image provided can then be the recorded aerial image, or a selected region of the recorded aerial image.

In a further configuration of the invention, the reference point corresponds to a desired position of the structure on the mask.

This measure has the advantage that the calculated position of the structure relative to the reference point directly corresponds to the deviation thereof from a desired position.

In a further configuration of the invention, the reference point is the midpoint of the image.

This measure has the advantage that the evaluation is simplified further.

If the image is provided as a region of a recorded aerial image, then the midpoint of the region is the midpoint of the aerial image.

In a further configuration of the invention, a point mirroring of the image at the reference point or of symmetry operations equivalent thereto is carried out as the symmetry operation.

This measure has the advantage that it can be carried out in a particularly simple manner. Provided that it is known that the structure itself has centrosymmetry, no further parameters have to be predefined.

In a further configuration of the invention, the position of the object is calculated as half of the displacement vector between the structure and mirror image.

This measure has the advantage that a simple and rapid calculation of the position is made possible in the case of centrosymmetric structures.

In a further configuration of the invention, the symmetry operations carried out are mirroring the image at least at a first reference mirror plane and at a mirrored reference mirror plane, in order to produce at least two mirrored structures, wherein the first reference mirror plane is parallel to a first mirror plane of the structure and the second reference mirror plane is parallel to a second mirror plane of the structure and all the reference mirror planes run through the reference point.

This measure has the advantage of also enabling the determination of positions of structures which are not centrosymmetric but have two mirror planes that are perpendicular to the plane of the mask.

In a further configuration of the invention, the image comprising a structure at which the first and second mirror planes are perpendicular to one another is firstly mirrored at the first reference mirror plane, the mirrored structure produced is mirrored at the second reference mirror plane, in order to produce a mirrored structure. The position of the structure is calculated from the displacement vector between structure and mirrored structure or between the two mirrored structures.

This measure has the advantage that the accuracy is increased by the redundant determination of a plurality of distances between image and mirror image or two mirror images by forming the average of the distances.

In a further configuration of the invention, the at least one displacement vector between structure and mirrored structure or between two mirrored structures is determined by cross-correlation.

This measure has the advantage that the distance can also be determined with subpixel accuracy in a reliable and rapid manner.

In a further configuration of the invention, the at least one displacement vector between structure and mirrored structure or between two mirrored structures is determined by the method of least error squares.

This measure has the advantage that the distance can be determined even in the case of images for which cross-correlation cannot be employed. Discontinuities in the profile of the grey levels in the edge region of the images can have the effect that the Fourier spectrum of the image is no longer bandwidth-limited, such that the desired accurate position determination is no longer possible by means of cross-correlation.

In a further configuration of the invention, at least one selected region of the image is masked and all image information outside the masked region is suppressed during the determination of the displacement vector.

This measure has the advantage that when determining the displacement vector, only the regions of the image which are actually provided for this purpose are taken into account. Discontinuities possibly occurring as a result of the masking in the edge region of the images pose no problems when determining the displacement vector when the abovementioned correlation method is employed.

The invention additionally comprises a position measuring device for determining the position of a structure within an image relative to a reference point, which has an evaluation unit, which carries out the steps in accordance with the method according to the invention.

The evaluation unit is a computer, for example, which is programmed in such a way that all the methods mentioned and their configurations are carried out.

It is understood that the features of the invention which have been mentioned above and those which are yet to be explained below can be used not only in the combinations described but also in further combinations or individually, without departing from the scope of the present invention.

The invention is described and explained in greater detail below on the basis of some selected exemplary embodiments and with reference to the drawings.

In the figures:

FIG. 1 shows a position measuring device 10, which serves for measuring the position of structures on masks.

Figure 1:
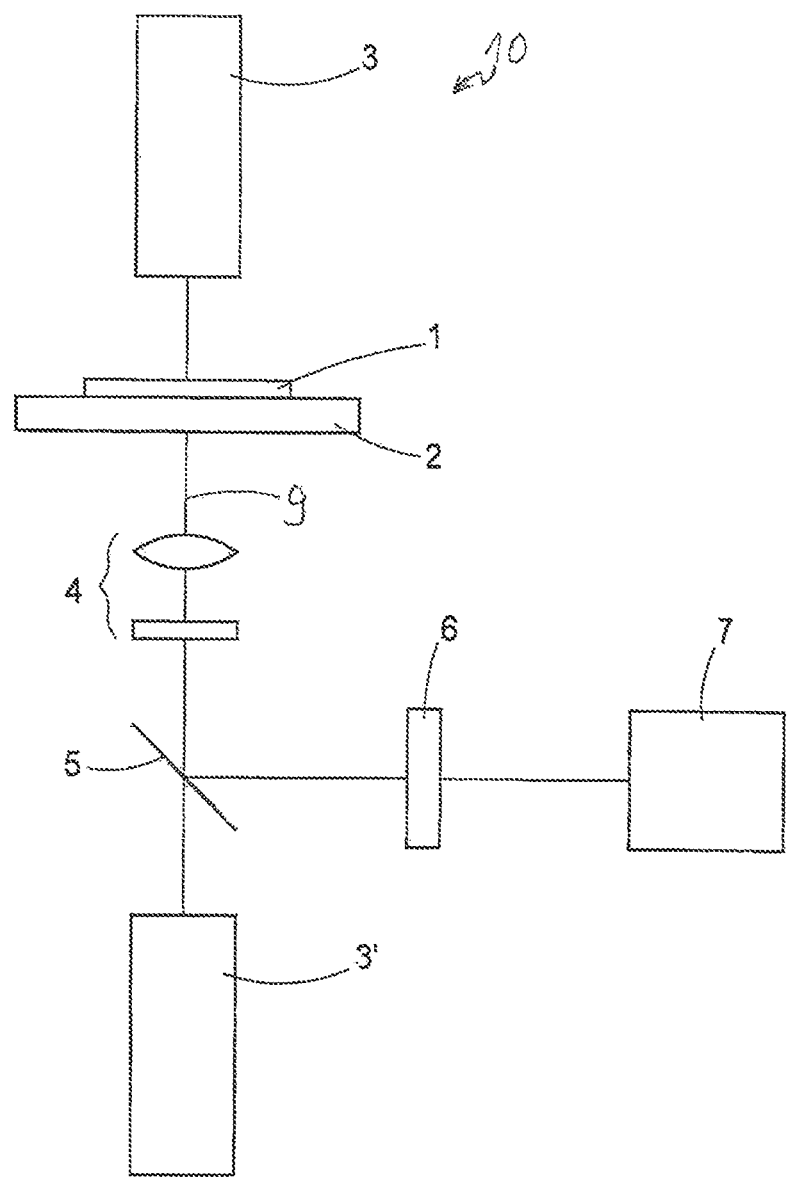
FIG. 1 shows a schematic diagram of a position measuring device.

A mask 1 for photolithography is mounted on a stage 2. The stage 2 can be moved for positioning the mask 1 in three spatial directions. In order to ensure a high accuracy, the current position or the path difference is monitored by means of laser-interferometric or other high-precision measuring instruments (not shown). The mask 1 and the stage 2 are arranged horizontally, and the mask plane is also designated as the X-Y plane. An illumination device 3 is arranged above the stage 2 with the mask 1. The illumination device contains at least one illumination source which emits coherent illumination light and which illuminates the mask via an illumination beam path. The illumination light source can be configured for example as a laser that emits light having a wavelength of 193 nm. The illumination device 3 serves for transmitted-light illumination of the mask 1. A further illumination device 3' is situated on the other side of the stage 2, said further illumination device serving to illuminate the mask 1 using reflected light. An excerpt from the mask 1 that is situated in the image field is imaged either by the illumination light passing through the mask 1, or by the illumination light reflected from it, via an imaging optical unit 4 and a beam splitter 5 onto a spatially resolving detector 6 which is configured as a CCD camera (charge coupled device). The optical axis of the imaging optical unit 4 is designated by the reference sign 9, and its direction is designated as a Z direction. The detected intensities of the image are digitized by an evaluation unit 7 and stored as a grey-scale image. The evaluation unit 7 is a computer programmed in such a way that all the method steps are performed.

The measurement of the positions of structures on a mask 1 is performed with respect to reference markings (alignment markers) on the mask 1. The indication of the position of structures on the mask is effected in the mask coordinate system. The latter is defined by two right-angled axes designated by x and y. In order to measure the position of the structures relative to the mask surface, prior to the measurement of the individual positions of the structures, the position of the mask on the stage is determined. This is possible, for example by determining the position of the edges of the mask 1 relative to markers on the stage having a known position. The laboratory coordinate system is defined by the position of the markers on the stage.

Figure 2:
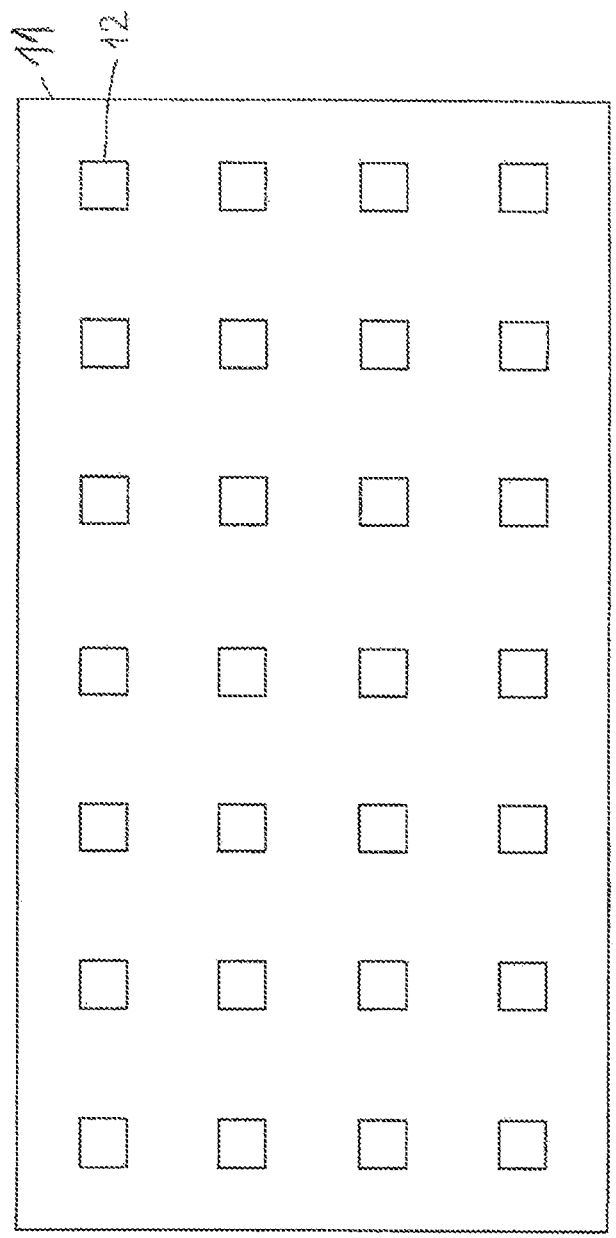
FIG. 2 shows a schematic diagram of an array of control structures on a mask.

The structures to be measured on masks can be crosses or squares, for example, which were written onto the mask for checking purposes. An array of such control structures 12 (registration pattern) on a mask 11 is illustrated in FIG. 2. Suitable used structures on the mask are also measured for monitoring purposes. For efficient comparison of the desired and actual positions of structures on masks, the positions of a center of symmetry of the structures are compared. The center of symmetry of a structure is the point of intersection of at least two mirror planes which are perpendicular to the mask plane, or the center of symmetry of a centrosymmetric structure.

The following explanations relate to the mask coordinate system. Conversion of the positions into other reference systems such as, for example, the laboratory coordinate system is possible, as indicated above.

In order to measure the position of a center of symmetry of a structure, by means of the stage 2 the mask 1 is aligned in the X-Y plane in such a way that the desired position of the center of symmetry lies on a defined point of the detector 6 and thus of a recorded aerial image, preferably in the center thereof. After the best focal plane has been determined by movement of the stage 2 in the Z direction, a grey-scale image is provided by detector 6 and evaluation unit 7. In this case, the displacement of the position off the center of symmetry from the midpoint of the aerial image corresponds to the positioning error of the structure. The actual position of the structure can be determined therefrom.

In one variant of the method, the position measuring device 10 is used to record an aerial image comprising a plurality of structures whose positions are to be determined. Prior to the recording of the aerial image, the mask 1 is aligned in the X-Y plane on the basis of the mask design in such a way that the desired position of the midpoint of the aerial image on the mask is known. Consequently, all the desired positions of the structures that the aerial image comprises are also known and can be specified in the coordinates of the aerial image. In order to determine the position of a structure, a region that comprises only said structure is selected and provided as an image. The midpoint of said image is predefined as a reference point. The displacement of a center of symmetry of a structure proceeding from the midpoint of a region thus makes it possible to determine the positioning error or the actual position of the structure on the mask.

In a further variant of the method, the structure is predefined as a region of a recorded aerial image, but the midpoint of the recorded aerial image is used as a reference point.

In one variant of the method, a provided image can also be altered by the masking of one region or a plurality of regions to be taken into account when determining the displacement vector.

The actual position $P_{x,y}$ of the structure in the mask coordinate system is given, for example, as:

$$P_{x,y} = B_{x,y} + S_{x,y}$$

$B_{x,y}$ is the reference point in the mask coordinate system, and $S_{x,y}$ is the distance between the center of symmetry of the structure and the reference point.

Figure 3:
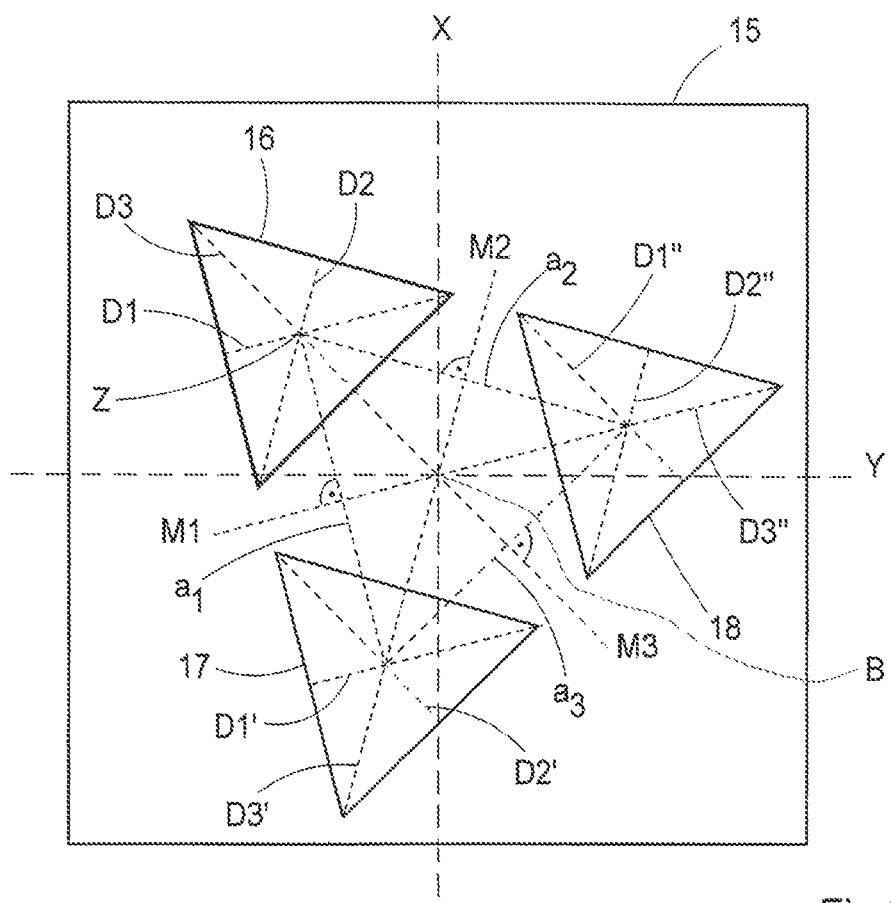
FIG. 3 shows a drawing for illustrating the determination of the position of a structure in an image on the basis of the example of an equilateral triangle.

FIG. 3 illustrates the schematic diagram of an image 15 having a structure 16 having the form of an equilateral triangle. For a simplification, the illustration shows only the contour of the triangle 16 and the mirror images 17 and 18 thereof, and not the profile of the grey levels of an image recorded by the detector 6. Reference point B lies in the center of the image as the point of intersection of the X- and Y-axes.

To afford a simpler understanding of the determination of the position of the center of symmetry, further auxiliary lines are depicted in FIG. 3. The triangle 16 has three mirror planes D1, D2 and D3. The triangle 16 can be mirrored at two mirror planes M1 and M2. M1 and M2 run parallel to D1 and D2, respectively, and intersect at the reference point B. A mirror image 17 having the mirror planes D1', D2' and D3' is obtained by mirroring the triangle 16 at M1. A mirror image 18 having the mirror planes D1", D2" and D3" is obtained by mirroring the triangle 16 at M2. The mirror images 17 and 18 can alternatively be obtained by mirroring one of the mirror images at the mirror plane M3.

From the mirror planes of the triangle 16 and mirror image 17 or triangle 16 and mirror image 18 or from two mirror images 17 and 18, as explained further below, by correlation of the images, the displacement vectors $$\vec{a}_1 = \begin{bmatrix} a_{1x} \\ a_{1y} \end{bmatrix}, \vec{a}_2 = \begin{bmatrix} a_{2x} \\ a_{2y} \end{bmatrix} \text{ and } \vec{a}_3 = \begin{bmatrix} a_{3x} \\ a_{3y} \end{bmatrix}$$

are then determined.

The displacement vectors are depicted in FIG. 3 for illustration purposes proceeding from the centers of symmetry. However, they generally designate the displacement of the triangle 16 and of the mirror image 17, 18 or of the mirror images 17, 18 relative to one another.

The position of the center Z of symmetry of the triangle 16 relative to the reference point B is calculated from the displacement vectors mentioned. The calculation from the displacement vectors $a_1$, $a_2$ and $a_3$ is described below.

In the present example, the reference point $B_{x,y}$ is the origin of the orthogonal coordinate system defined by the X- and Y-axes illustrated by dashed lines.

It can be assumed that the displacement vectors are normal to the respective planes of symmetry.

The position of the plane D1 of symmetry of the triangle 16 is given by the displacement vector $a_1$ of triangle 16 and mirror image 17 as:

$$-\frac{a_{1x}}{2}x - \frac{a_{1y}}{2}y = \left(\frac{a_{1x}}{2}\right)^2 + \left(\frac{a_{1y}}{2}\right)^2. \qquad D1$$

The position of the plane D2 of symmetry of the triangle 16 is given by the displacement vector $a_2$ of triangle 16 and mirror image 18 as:

$$-\frac{a_{2x}}{2}x - \frac{a_{2y}}{2}y = \left(\frac{a_{2x}}{2}\right)^2 + \left(\frac{a_{2y}}{2}\right)^2. \quad\quad \text{D2}$$

The position of the plane D3 of symmetry of the triangle 16 is given by the displacement vector $a_3$ of mirror image 17 and mirror image 18 as:

$$-\frac{a_{3x}}{2}x - \frac{a_{3y}}{2}y = \left(\frac{a_{3x}}{2}\right)^2 + \left(\frac{a_{3y}}{2}\right)^2. \quad\quad \text{D3}$$

The distance $S_{x,y}$ between the center Z of symmetry of the triangle 16 and the reference point B is determined from the linear equations D1, D2 and D3. If two linear equations are known, the coordinates $S_x$ and $S_y$ are unambiguously defined. If three linear equations are known, the solution of the over-determined equation system is determined by the minimization of the sum of the least error squares.

Figure 4:
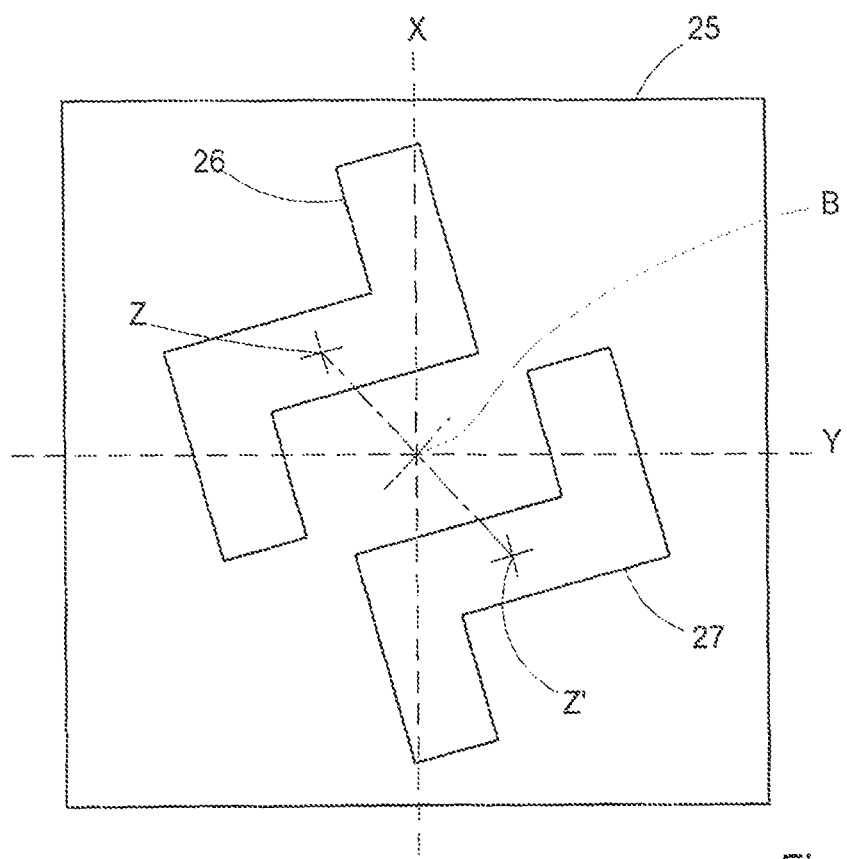
FIG. 4 shows a drawing for illustrating the determination of the position of a structure in an image on the basis of the example of a centrosymmetric structure.
Figure 5:
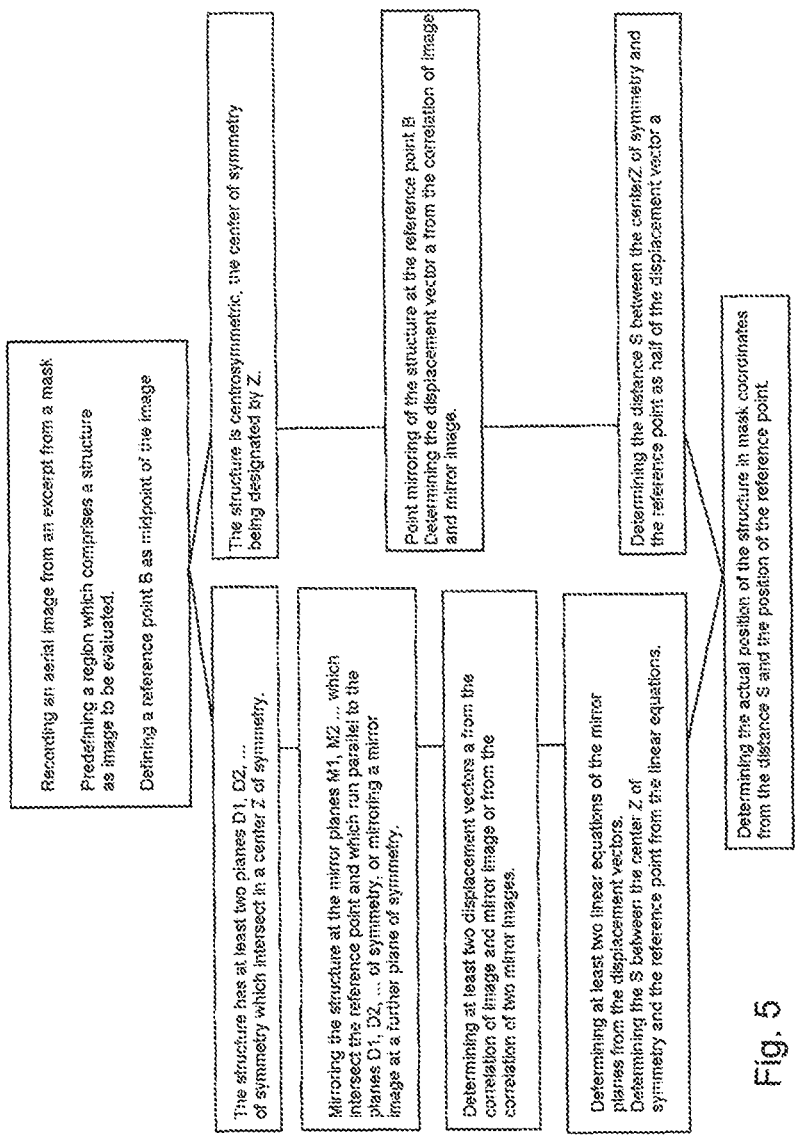
FIG. 5 shows a schematic diagram of the sequence of an example of the method according to the invention.

FIG. 4 illustrates the schematic diagram of an image 25 having a centrosymmetric structure 26. For simplification, once again only the contour of the structure 26 and the mirror image 27 thereof is illustrated. Reference point B once again lies in the center of the image as the point of intersection of the X- and Y-axes, which define the orthogonal coordinate system mentioned.

The mirror image 27 is obtained by double mirroring at mirror planes which intersect at the reference point B, which are perpendicular to the image plane and which run perpendicular to one another in the image plane, preferably in directions of the X- and Y-axes. An equivalent symmetry operation is the rotation of the structure 26 by 180° about the reference pint B or point mirroring at point B.

As described below, the displacement vector a—having the X and Y components $a_x$ and $a_y$—of the centers of symmetry of the centrosymmetric structure 26 and the mirror image 27 thereof is determined. The coordinates of the position of the center of symmetry to be determined then result as $S_x=a_x/2$ and $S_y=a_y/2$.

In order to determine the displacement vector of two structures from image and mirror image or from two mirror images, a first method uses the method of least error squares. The images, this can be image and mirror image or two mirror images, are designated hereinafter as image 1 and image 2.

In order to determine the displacement vector of two structures from image 1 and image 2, in accordance with formula (1) below, the two-dimensional correlation between image 1 and image 2 is calculated, as disclosed in DE 10 2006 059 431 A1.

$$C_{m,n} = Re\left(\frac{1}{P\cdot Q}\sum_{p=1}^{P}\sum_{q=1}^{Q} \hat{a}_{p,q}\cdot b_{p,q}^{*}\cdot (\mu_p)^{1-m}\cdot (v_q)^{1-n}\right) \quad\quad (1)$$

$$= \sum_{m'=1}^{P}\sum_{n'=1}^{Q} \hat{A}_{m',n'}\cdot B_{m'+1-m,n'+1-n}$$

In the ideal case $B_{m,n} \propto \hat{A}_{m,n}$, and the maximum is at m=1=n, with the displaced image accordance with $$\hat{A}_{m,n} \equiv Re\left(\sum_{m=1}^{P}\sum_{n=1}^{Q} \hat{a}_{p,q}\cdot (\mu_p)^{1-m}\cdot (v_q)^{1-n}\right) \quad\quad (2)$$

The images have P pixel lines and Q pixel columns, the phasors being defined as follows:

$$\mu_p = e^{-\pi i \cdot \eta_p}, p=1\ldots P \quad\quad (3)$$

$$v_q = e^{-2\pi i \cdot \xi_q}, q=1\ldots Q \quad\quad (4)$$

with the following coordinates $$\eta_p = \frac{p-1}{P} - \text{floor}\left(\frac{p-1}{P} + \frac{1}{2}\right) \quad\quad (5)$$

$$\xi_q = \frac{q-1}{Q} - \text{floor}\left(\frac{q-1}{Q} + \frac{1}{2}\right). \quad\quad (6)$$

The function floor returns the largest integer of the argument which is less than or equal to the argument.

In a next step (step 3), the whole pixels ($\hat{m}\neq1$, $\hat{n}\neq1$) for which the correlation is maximal ($\hat{C}=C_{\hat{m},\hat{n}}$) are then determined.

In the subsequent step 4, the subpixel displacement vector ($\Delta x$, $\Delta y$) is determined. Two alternatives are described below for this step.

In accordance with the first alternative (step 4a), the so-called antisymmetry of the correlation matrix will be minimized. For this purpose, relative to a center of symmetry ($\hat{m}$, $\hat{n}$) for each pixel (m, n) and the correspondingly mirrored pixel ($2\cdot\hat{m}-m$, $2\cdot\hat{n}-n$), the squared differences ($C_{m,n} - C_{2\cdot\hat{m}-m, 2\cdot\hat{n}-n}$)$^2$ are summed and are designated as AoC$\hat{m}$, $\hat{n}$.

Afterward, AoC$_{\hat{m}\pm1,\hat{n}\pm1}$ is calculated, in which adjacent pixels are used as a center. The two-dimensional subpixel displacement vector ($\Delta x \approx \hat{n}-1$, $\Delta y \approx \hat{m}-1$) is then determined by means of a parabolic fit or parabolic interpolation near the extremum m=$\hat{m}$, n=$\hat{n}$.

In accordance with the second alternative (step 4b) of step 4, the correlation $C_{m,n}$ for the pixels m=$\hat{m}$, $\hat{m}\pm1$ and $\hat{n}$, $\hat{n}\pm1$ can be used directly for determining the subpixel displacement vector ($\Delta x$, $\Delta y$). In this case, the maximum of the correlation is determined by a parabolic fit near the extremum m=$\hat{m}$, n=$\hat{n}$.

The subpixel deviation ($\Delta x$, $\Delta y$) determined in step 4a or 4b is added to the total displacement $X_{total}$ or $Y_{total}$ already present (step 5), in order to calculate a new total displacement $X_{total}$, $Y_{total}$.

$$x_{total}=x_{total}+\Delta x; y_{total}=y_{total}\Delta y \quad\quad (7)$$

When step 4 is first run through, the total displacement already present is the displacement from (m, n) to (1, 1). In subsequent iteration loops, the total displacement already present is, of course, always the total displacement calculated in step 5 of the preceding iteration loop.

From said total displacement, the phase shift of the spectrum is produced (step 6) by multiplication $$\hat{a}_{p,q}=a_{p,q}\cdot(\mu_p)^{-y_{total}}\cdot(v_q)^{-x_{total}} \quad\quad (8)$$

A check is then made to determine whether the subpixel displacement ($\Delta x$, $\Delta y$) is less than a predefined maximum value (step 7). If this is not the case, the correlation $C_{m,n}$ is calculated anew in accordance with formula 1 above with the phase shift in accordance with formula 8 (step 8), which corresponds to the displacement of the two images image 1 and image 2 with respect to one another by the total displacement determined in step 5.

Steps 4-7 are then repeated, wherein the displacement by whole pixels (step 3) no longer has to be carried out. In step 6 carried out anew, the new total displacement is, or course, applied again to image 2. In terms of the result this is the same as a displacement of the already displaced image 2 only by the subpixel displacement vector calculated anew. In this case, formula (7) should be replaced by the following formula (7')

$$x_{total} = \Delta x, y_{total} = \Delta y \quad (7')$$

Steps 8 and 4-7 are repeated until it is ascertained in step 7 that the subpixel displacement is less than a predefined limit value. $X_{total}$ and $Y_{total}$ correspond to the x and y components $a_x$ and $a_y$ of the displacement vector a.

In order to determine the displacement vector of two structures from image and mirror image or from two mirror images, a second method uses the method of least error squares. Image and mirror image are designated hereinafter once again as image 1 and image 2.

In this method it is advantageous that, contrary to the above method, it can also be employed if discontinuities occur in the intensity profile of the edge region of image 1. In image 1 and/or image 2, a selected region of the image can be masked. All image information outside the masked region is suppressed when determining the displacement vector. Image 1 and image 2 thus maintain the same size. In image 1, it is also possible to mask a plurality of edges of a structure.

The position is determined by means of the method of least squares, wherein image 1 is displaced cyclically relative to image 2 and the sum over all the pixels of the squared difference in the intensities of the two images image 1 and image 2 is calculated for each displacement position. The sum over all the pixels of the squared difference in the intensities of image 1 and image 2 corresponds to the superimposition of the two images, wherein image 2 is stationary and image 1 is displaced.

A cyclic displacement is understood here to mean that the image information of the first image image 1 which is pushed beyond the image edge of the second image image 2 during the displacement is reinserted on the respective opposite image edge side of image 2.

That displacement position is sought for which the above-described weighted sum, which is also designated hereinafter as optimization function, assumes an extremum (maximum or minimum). The displacement position for which the value thus calculated is an extremum (a maximum or minimum depending on the choice of sign during the calculation) corresponds to the best approximation for the displacement vector to be determined.

An optimization function M(x,y) can be represented, e.g. by formula 1a below:

$$M(x, y) = -\sum_{m=0}^{P-1}\sum_{n=0}^{Q-1} K_{m,n} \cdot [A_{m,n}(x, y) - B_{m,n}]^2 \xrightarrow{(x,y)} \text{maximum} \quad (1a)$$

where $K_{m,n}$ is the normalized 2D masking (also called keyhole masking or keyhole apodization below), with $$\sum_{m=0}^{P-1}\sum_{n=0}^{Q-1} K_{m,n} = 1.$$

$A_{m,n}(x,y)$ represents the image 1 to be displaced, which was displaced by a vector (-x,-y), and $B_{m,n}$ denotes the stationary image 2. Both recordings are of the same size and each has P×Q pixels. Both recordings are matrices composed of P×Q pixels of the same size. In one variant of the exemplary embodiment P=Q=1000. This corresponds to the matrix of pixels of the detector 6 of the position measuring device 10. By virtue of the summation, the intensity values of the two recordings which are present at the same pixel position (taking account of the displacement (-x,y)) in both recordings are always subtracted from one another.

Since $B_{m,n}$ is not displaced and, consequently, is not dependent on the displacement vector (-x,-y), the optimization function can be rewritten as follows:

$$M(x, y) = \sum_{m=0}^{P-1}\sum_{n=0}^{Q-1} K_{m,n} \cdot [2 \cdot A_{m,n}(x, y) \cdot B_{m,n} - A_{m,n}(x, y)^2] \xrightarrow{(x,y)} \text{maximum} \quad (2a)$$

If a spectral decomposition is carried out for image 1 and image 2, formula 2a can be written as follows:

$$M(x, y) = \frac{1}{P \cdot Q} \sum_{p,q} \overbrace{[2 \cdot a_{p,q} \cdot \beta^*_{p,q} - \alpha_{p,q}]}^{=Kernel_{p,q}} \cdot e^{2\pi i(x \cdot \xi_q + y \cdot \eta_p)} \xrightarrow{(x,y)} \text{maximum} \quad (3a)$$

where here the asterisk (*) indicates that the corresponding variable is complex conjugate.

The following spectral decompositions were carried out for formula 3a above.

$$A_{m,n}(x, y) = \frac{1}{P \cdot Q} \sum_{p,q} a_{p,q} \cdot e^{2\pi i([n+x]\cdot\xi_q + [m+y]\cdot\eta_p)} \quad (4a)$$

$$A_{m,n}(x, y)^2 = \frac{1}{P \cdot Q} \sum_{p,q} \alpha_{p,q} \cdot e^{2\pi i([n+x]\cdot\xi_q + [m+y]\cdot\eta_p)} \quad (5a)$$

$$K_{m,n} \cdot B_{m,n} = \frac{1}{P \cdot Q} \sum_{p,q} \beta_{p,q} \cdot e^{2\pi i(n\cdot\xi_q + m\cdot\eta_p)} \quad (6a)$$

$$K_{m,n} = \frac{1}{P \cdot Q} \sum_{p,q} \kappa_{p,q} \cdot e^{2\pi i(n\cdot\xi_q + m\cdot\eta_p)} \quad (7a)$$

Furthermore, $\alpha_{p,q}$ denotes the following spectral convolution $$\alpha_{p,q} \equiv (a \otimes a)_{p,q} = \frac{1}{P \cdot Q} \sum_{p',q'} a_{p-p',q-q'} \cdot a_{p',q'} \quad (8a)$$

and the functions $\xi_q$, $\eta_p$ are defined in accordance with formulae 9a and 10a below $$\xi_q = \frac{q}{Q} - \text{floor}\left(\frac{q}{Q} + \frac{1}{2}\right); q = 0 \ldots Q-1 \quad (9a)$$

$$\eta_p = \frac{p}{P} - \text{floor}\left(\frac{p}{P} + \frac{1}{2}\right); p = 0 \ldots P-1 \quad (10a)$$

The function floor returns the largest integer of the argument which is less than or equal to the argument. In this way, the relative position of image 1 relative to image 2 can be determined numerically with high accuracy.

By virtue of the weighted summation in accordance with the optimization function specified above, a hard edge is inserted in the superimposition, but said hard edge, in the spectral decomposition, does not have the effect that no bandwidth limitation is present. Thus, in the difference in accordance with the kernel$_{p,q}$ in formula 3a, although neither $\beta^*_{p,q}$ nor $\kappa_{p,q}$ is bandwidth-limited, both the minuend and the subtrahend are bandwidth-limited, since $a_{p,q}$ and $\alpha_{p,q}$ are spectrally bandwidth-limited. On account of the convolution in accordance with formula 8, although $\alpha_{p,q}$ has an increased spectral range relative to $a_{p,q}$, it is still spectrally band-limited. Consequently, a numerical solution to the formula 3a which is very accurate is possible. Moreover, the subtrahend $\alpha \cdot \kappa^*$ can be regarded as a term that balances the effect of the leading cross-correlation term $2a \cdot \beta^*$. As a result, inhomogeneities of the intensity can be present on the edge trajectory of the weighting and the method according to the invention still yields the relative position sought. In conventional correlation methods, such as from DE 10 2007 033 815 A1, for example, such edge inhomogeneities have the effect that no practical results can be determined.

It has been found that not all displacement positions lead to practical results since the optimization function often has a plurality of local maxima or minima. Therefore, by way of example, the relative position of image 1 with respect to image 2 or a part thereof is determined relatively coarsely by means of a correlation method, as explained above. Such relatively coarse position determination is understood here to be, in particular, pixel-accurate determination. This relative position displacement is then used as a start value for the optimization function in order to ensure that the extremum then found is also the sought local extremum of the optimization function.

What is claimed is:

1. A method for determining the position of a structure within an image relative to a reference point, wherein the structure has a center of symmetry, comprising the following steps:
   providing an image which comprises the structure and which has a reference point,
   carrying out, at a computer, at least one symmetry operation of the image with respect to the reference point, by means of which at least one mirror image is obtained which has a mirrored structure congruent relative to the structure,
   determining, at the computer, at least one displacement vector between a structure and one mirrored structure or two mirrored structures, and
   calculating, at the computer, the position of the structure as a position of the center of symmetry of the structure relative to the reference point from the at least one displacement vector.

2. The method according to claim 1, wherein the reference point corresponds to a desired position of the structure on a mask.

3. The method according to claim 1, wherein the reference point comprises the midpoint of the image.

4. The method according to claim 1, wherein a point mirroring of the image at the reference point or of symmetry operations equivalent thereto is carried out as the symmetry operation.

5. The method according to claim 4, wherein the position of the object is calculated as half of the displacement vector between the structure and mirror image.

6. The method according to claim 1, wherein the symmetry operations carried out comprise:
   mirroring of the image at least at a first reference mirror plane and at a mirrored reference mirror plane, in order to produce at least two mirrored structures, wherein the first reference mirror plane is parallel to a first mirror plane of the structure and the second reference mirror plane is parallel to a second mirror plane of the structure and all of the reference mirror planes run through the reference point.

7. The method according to claim 6, wherein the image comprises a structure at which the first and second mirror planes are perpendicular to one another is firstly mirrored at the first reference mirror plane, the mirrored structure produced is mirrored at the second reference mirror plane, in order to produce a mirrored structure, and the position of the structure is calculated from the displacement vector between structure and mirrored structure or between two mirrored structures.

8. The method according to claim 1, wherein the at least one displacement vector between structure and mirrored structure or between two mirrored structures is determined by cross-correlation.

9. The method according to claim 1, wherein the at least one displacement vector between structure and mirrored structure or between two mirrored structures is determined by the method of least error squares.

10. The method according to claim 1, wherein at least one selected region of the image is masked and all the image information outside the masked region is suppressed during the determination of the displacement vector.

11. A position measuring device for determining the position of a structure within an image relative to a reference point, which has an evaluation unit that performs the following steps:
    providing an image which comprises the structure and which has a reference point,
    carrying out, at the evaluation unit, at least one symmetry operation of the image with respect to the reference point, by means of which at least one mirror image is obtained which has a mirrored structure congruent relative to the structure,
    determining, at the evaluation unit, at least one displacement vector between a structure and one mirrored structure or two mirrored structures, and
    calculating, at the evaluation unit, the position of the structure as a position of the center of symmetry of the structure relative to the reference point from the at least one displacement vector.

12. The position measuring device according to claim 11, wherein the reference point corresponds to a desired position of the structure on a mask.

13. The position measuring device according to claim 11, wherein the reference point comprises the midpoint of the image.

14. The position measuring device according to claim 11, wherein a point mirroring of the image at the reference point or of symmetry operations equivalent thereto is carried out as the symmetry operation.

15. The position measuring device according to claim 14, wherein the position of the object is calculated as half of the displacement vector between the structure and mirror image.

16. The position measuring device according to claim 11, wherein the symmetry operations carried out comprise:
    mirroring of the image at least at a first reference mirror plane and at a mirrored reference mirror plane, in order to produce at least two mirrored structures, wherein the first reference mirror plane is parallel to a first mirror plane of the structure and the second reference mirror plane is parallel to a second mirror plane of the structure and all of the reference mirror planes run through the reference point.

17. The position measuring device according to claim 16, wherein the image comprises a structure at which the first and second mirror planes are perpendicular to one another is firstly mirrored at the first reference mirror plane, the mirrored structure produced is mirrored at the second reference mirror plane, in order to produce a mirrored structure, and the position of the structure is calculated from the displacement vector between structure and mirrored structure or between two mirrored structures.

18. The position measuring device according to claim 11, wherein the at least one displacement vector between structure and mirrored structure or between two mirrored structures is determined by cross-correlation.

19. The position measuring device according to claim 11, wherein the at least one displacement vector between structure and mirrored structure or between two mirrored structures is determined by the method of least error squares.

20. The position measuring device according to claim 11, wherein at least one selected region of the image is masked and all the image information outside the masked region is suppressed during the determination of the displacement vector.

\* \* \* \* \*

UNITED STATES PATENT AND TRADEMARK OFFICE
CERTIFICATE OF CORRECTION

PATENT NO. : 8,717,581 B2  
APPLICATION NO. : 13/247914  
DATED : May 6, 2014  
INVENTOR(S) : Mario Laengle It is certified that error appears in the above-identified patent and that said Letters Patent is hereby corrected as shown below:

In the Specification

Column 8

Line 10 (approx.), delete "$\mu_p = e^{-\pi i \cdot \eta_p}, p = 1...P$" and insert -- $\mu_p = e^{-2\pi i \cdot \eta_p}, p = 1...P$ --

Signed and Sealed this  
Twenty-second Day of July, 2014

Michelle K. Lee  
*Deputy Director of the United States Patent and Trademark Office*